(12) United States Patent
Downing

(10) Patent No.: US 8,913,385 B2
(45) Date of Patent: Dec. 16, 2014

(54) EFFICIENT COOLING DUCT

(71) Applicant: Hamilton Sundstrand Corporation, Windsor Locks, CT (US)

(72) Inventor: Robert Scott Downing, Rockford, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 214 days.

(21) Appl. No.: 13/647,018

(22) Filed: Oct. 8, 2012

(65) Prior Publication Data

US 2014/0098494 A1    Apr. 10, 2014

(51) Int. Cl.
H05K 7/20    (2006.01)

(52) U.S. Cl.
USPC .............. 361/695; 361/679.48; 361/679.49; 361/679.5; 361/679.51; 361/690; 361/694; 165/80.2; 165/80.3; 165/104.33; 165/114; 165/122; 454/184

(58) Field of Classification Search
USPC ............. 361/679.46–679.52, 690–697, 361/704–715, 719–724; 165/80.2, 80.3, 165/104.33, 122–126, 185; 257/706, 713, 257/718, 719, 722; 454/184; 312/223.2, 312/223.3, 236, 265.3; 174/15.1, 15.3, 174/16.1, 16.3, 252
See application file for complete search history.

(56) References Cited

U.S. PATENT DOCUMENTS

| | | | |
|---|---|---|---|
| 2,618,133 A | 11/1952 | Kennedy | |
| 3,196,850 A | 7/1965 | Jones | |
| 4,103,737 A * | 8/1978 | Perkins | 165/109.1 |
| 4,573,544 A | 3/1986 | Hoch et al. | |
| 4,953,634 A * | 9/1990 | Nelson et al. | 165/147 |
| 5,072,787 A * | 12/1991 | Nakamichi | 165/80.3 |
| 5,077,601 A * | 12/1991 | Hatada et al. | 257/722 |
| 5,597,035 A * | 1/1997 | Smith et al. | 165/80.3 |
| 5,669,813 A * | 9/1997 | Jairazbhoy et al. | 454/69 |
| 5,734,551 A * | 3/1998 | Hileman et al. | 361/695 |
| 5,940,266 A | 8/1999 | Hamilton et al. | |
| 6,364,009 B1 * | 4/2002 | MacManus et al. | 165/185 |
| 6,515,859 B2 * | 2/2003 | Roberts et al. | 361/695 |
| 6,525,936 B2 | 2/2003 | Beitelmal et al. | |
| 6,587,335 B1 | 7/2003 | Nelson et al. | |
| 6,678,157 B1 * | 1/2004 | Bestwick | 361/695 |
| 6,888,725 B2 * | 5/2005 | Kubo et al. | 361/719 |
| 6,970,353 B2 | 11/2005 | Brovald et al. | |
| 7,061,761 B2 * | 6/2006 | Tucker et al. | 361/695 |
| 7,167,363 B1 * | 1/2007 | Cushman et al. | 361/694 |
| 7,215,543 B2 | 5/2007 | Arbogast et al. | |
| 7,248,476 B2 * | 7/2007 | Holmes et al. | 361/695 |
| 7,310,228 B2 * | 12/2007 | Chen | 361/695 |
| 7,447,021 B2 * | 11/2008 | Chen | 361/695 |
| 7,760,506 B1 * | 7/2010 | Wang et al. | 361/709 |
| 7,990,706 B2 | 8/2011 | Miyahara et al. | |
| 8,068,338 B1 * | 11/2011 | Tamarkin | 361/692 |
| 8,081,465 B2 * | 12/2011 | Nishiura | 361/703 |
| 8,300,409 B2 * | 10/2012 | Wei et al. | 361/690 |

* cited by examiner

Primary Examiner — Michail V Datskovskiy
(74) Attorney, Agent, or Firm — Kinney & Lange, P.A.

(57) ABSTRACT

A cooling system comprises an electronics module and a duct. The electronics module produces more heat at a first location than at a second location, and is rated to a safe operating temperature. The duct surrounds the electronics module, and has a shaped baffle with a constricted region near the first location and an open region near the second location. The expanded region has greater cross-sectional flow area than the constricted region. Airflow through the duct cools both the first location and the second location to within an efficiency margin below the safe operating temperature.

20 Claims, 3 Drawing Sheets

EFFICIENT COOLING DUCT

BACKGROUND

The present invention relates generally to electronics cooling, and more particularly to cooling duct contours.

Electronic components are typically rated for a known maximum temperature. An electronic component may suffer damage or rapid deterioration above this rated temperature. Electronics are commonly cooled below rated temperatures to avoid loss of component lifetime. Components with limited thermal output or situated in cool environments may be cooled by passive convection or conduction to a cold plate or cooled structure. Hotter components and components situated in relatively hot environments benefit from active cooling.

Direct air cooling is commonly used to dissipate heat from electronics modules such as transformers and inductors. Airflow from a fan or bleed is directed onto and around the electronics module for convective cooling, with faster airflow dissipating heat more efficiently. Electronics modules are commonly cooled by unconstrained direct blast air flow from a fan outlet or situated in cooling ducts that channel airflow towards and across surfaces of the electronics modules. Most cooling ducts are substantially uncontoured tubes of rectangular or circular cross-section. Direct air cooling is often supplemented by passive cooling such as with heat pipes and/or by direct conduction.

The fluid power expended to drive direct air cooling airflow through a cooling duct or system is $$\text{Power} = (v_F)(\Delta P) \quad \text{[Equation 1]}$$

where $v_F$ is volumetric airflow and $\Delta P$ is the pressure drop in the airflow direction. Larger pressure drops across the cooling duct thus cost more power. This power may for instance be provided by a larger or faster fan, or by increased bleed from a separate air system (e.g. a gas turbine engine compressor). Conventional uncontoured ducts often meet component cooling requirements by supplying high flow rates at high velocities, with large resulting pressure drops. The high fan head and volumetric flow result in increased power costs that are inefficient for many applications.

SUMMARY

The present invention is directed toward a cooling system comprising an electronics module and a duct. The electronics module produces more heat at a first location than at a second location, and is rated to a safe operating temperature. The duct surrounds the electronics module, and has a shaped baffle with a constricted region near the first location and an expanded region near the second location. The expanded region has greater cross-sectional flow area than the constricted region. Airflow through the duct cools both the first location and the second location to within an efficiency margin below the safe operating temperature.

DETAILED DESCRIPTION

Figure 1:
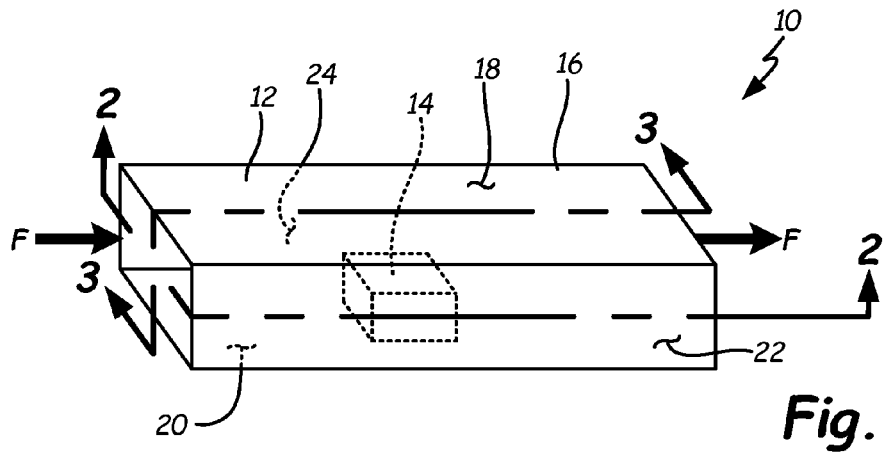
FIG. 1 is a perspective view of a cooling duct according to the present invention.

FIG. 1 is a perspective view of cooling system 10 comprising cooling duct 12 and electronics module 14. Cooling duct 12 is a rigid air passage with outer wall 16 that carries cooling airflow F past electronics module 14, as described in further detail below with respect to FIGS. 2 and 3. Outer wall 16 is a structural outer casing of cooling duct 12 comprising top wall 18, bottom wall 20, and side walls 22 and 24. Bottom wall 20 may, in some embodiments, be a surface of a supporting chassis. Cooling duct 12 may, for instance, be formed of plastic or sheet metal. Electronics module 14 is a heat-producing component such as a transformer or inductor rated to a safe temperature $T_{safe}$. Safe temperature $T_{safe}$ is selected to limit or substantially avoid damage or deterioration from overheating so long as electronics module 14 is kept below $T_{safe}$. In some embodiments, electronics module 14 may be an enclosure housing a plurality of different electronic components. Electronics module 14 may produce more heat in some locations than others, resulting in "hot spots" on the surface of electronics module 14 that require additional cooling to avoid damage or decreased lifetime for electronics module 14.

Cooling duct 12 encloses electronics module 14 and guides cooling airflow F towards and across surfaces of electronics module 14. Electronics module 14 is mounted to an interior surface of cooling duct 12, and may be conductively cooled through this point of contact in addition to the direct air cooling provided by airflow F. In some embodiments, this conductive cooling may be augmented with a heat plate or heat pipe system embedded in cooling duct 12. Although only one electronics module 14 is shown in cooling duct 12, some embodiments of cooling duct 12 may provide cooling for multiple electronics modules.

Airflow F may be provided by a fan, a bleed from a larger air system, or any other airflow source at a low temperature relative to electronics module 14. Cooling duct 12 is depicted as a straight duct with a rectangular cross-section. In other embodiments, cooling duct 12 may have a curved or polygonal cross-section. Bearing in mind that increased duct curvatures that restrict air flow F and increase local velocities tend to increase pressure drop across cooling duct 12, some embodiments of cooling duct 12 may also feature turns or bends that impose a change in direction on airflow F. Cooling duct 12 includes shaped baffle 26 as described below with respect to FIGS. 2 and 3. Shaped baffle 26 tailors airflow speeds towards and across electronics module 12 to cool all faces of electronics module below safe temperature $T_{safe}$ with minimum loss of pressure, and therefore with minimum expenditure of fluid power.

Figure 2:
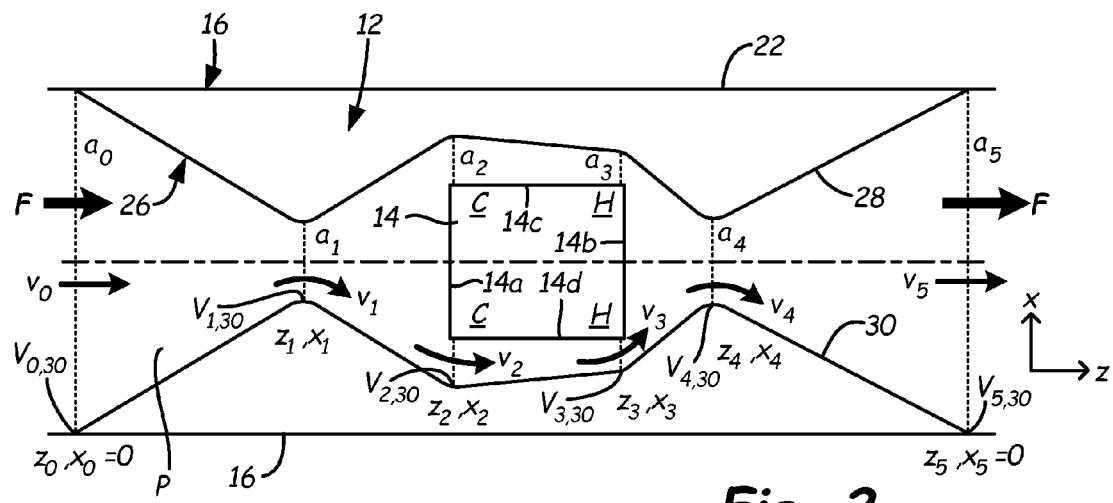
FIG. 2 is a first cross-sectional view of the cooling duct of FIG. 1.
Figure 3:
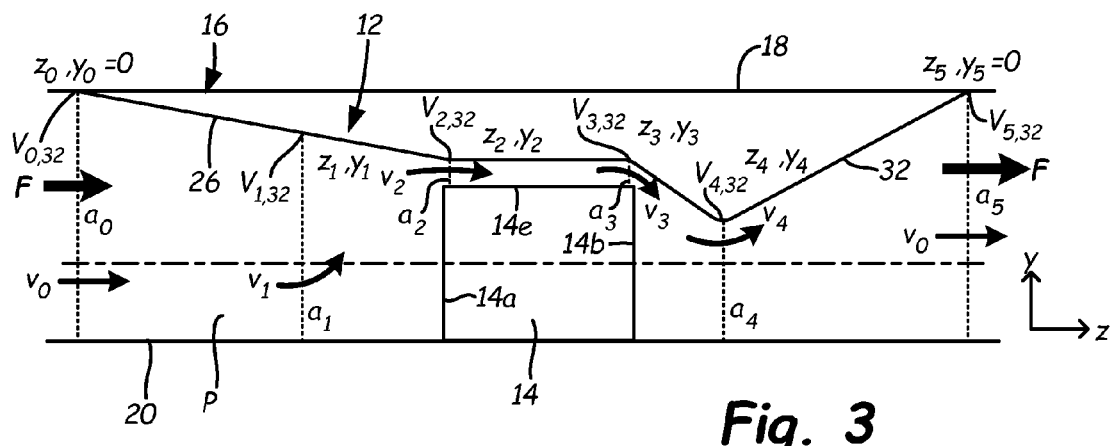
FIG. 3 is a second cross-sectional view of the cooling duct of FIG. 1.

FIGS. 2 and 3 are cross-sectional views of cooling duct 12 through orthogonal section planes 2-2 and 3-3, respectively, from FIG. 1. FIGS. 2 and 3 illustrate outer wall 16 and shaped baffle 26 of cooling duct 12, as well as electronics module 14. Electronics module 14 has exposed front face 14a, rear face 14b, side faces 14c and 14d, and top face 14e. FIG. 2 illustrates side walls 22 and 24, while FIG. 3 illustrates top wall 18 and bottom wall 20. In the depicted embodiment, shaped baffle 26 does not extend to bottom wall 20, which acts as a mounting platform for electronics module 14. In addition to anchoring electronics module 14, bottom wall 20 may provide additional conductive cooling to electronics module 14, and may include a conductive cold plate or heat pipe plate for this purpose. In alternative embodiments of cooling duct 12, shaped baffle 26 may extend to all or part of bottom wall 20.

Shaped baffle 26 is an internal shroud contoured to constrain airflow near electronics module 14 for optimal cooling. Top wall 18 and side walls 22 and 24 abut corresponding surfaces 32, 28, and 30, respectively, of shaped baffle 26. As shown in FIGS. 2 and 3, surfaces 28, 30, and 32 each comprise five relatively angled planes defined by six vertices. Surface 30 is defined by vertices $V_{0,30}$, $V_{1,30}$, $V_{2,30}$, $V_{3,30}$, $V_{4,30}$, and $V_{5,30}$, while surface 32 is defined by vertices $V_{0,32}$, $V_{1,32}$, $V_{2,32}$, $V_{3,32}$, $V_{4,32}$, and $V_{5,32}$. Surface 28 is similarly defined, although vertices of surface 28 are not labeled. Each vertex $V_{n,30}$ is defined in FIG. 2 by axial coordinate $z_n$ and lateral coordinate $x_n$, while each vertex $V_{n,32}$ is defined in FIG. 3 by axial coordinate $z_n$ and height coordinate $y_n$. Although FIGS. 2 and 3 depict six vertices of surfaces 28, 30, and 32, a larger or smaller number of vertices may be used in some embodiments. In particular, a larger number of vertices will result in a smoother airflow path P with fewer abrupt turns, and accordingly in a lower overall pressure drop and increased power efficiency. Shaped baffle 26 may also be streamlined by blunting or rounding vertices $V_1, V_2, \ldots, V_4$ to reduce the abruptness of flow path transitions between planes of shaped baffle 26. By rounding and increasing the number of vertices defining shaped baffle 26, shaped baffle 26 may be made substantially continuously curved. Shaped baffle 26 is described herein as comprising three sides 28, 30, and 32 corresponding to side walls 18 and 22 at right angles with top wall 24, respectively. In alternative embodiments, shaped baffle 26 may comprise more or fewer sides, or even a curved surface (e.g. with a circular or elliptical flow cross-section). Some embodiments of cooling duct 12 may feature more than one separate shaped baffle to constrain airflow near electronics module 14.

Shaped baffle 26, bottom wall 20, and electronics module 14 together define airflow path P through cooling duct 12. The cross-sectional area of airflow path P varies over the axial (z) extent of cooling duct 12 based on the contour or shaped baffle 26. In particular, the location of vertices $V_{0,30}$, $V_{1,30}$, $V_{2,30}$, $V_{3,30}$, $V_{4,30}$, and $V_{5,30}$, $V_{0,32}$, $V_{1,32}$, $V_{2,32}$, $V_{3,32}$, $V_{4,32}$, and $V_{5,32}$, and corresponding vertices of surface 28 determine corresponding cross-sectional flow areas $a_0$, $a_1$, $a_2$, $a_3$, $a_4$, and $a_5$ through cooling duct 12 at axial locations $z_0$, $z_1$, $z_2$, $z_3$, $z_4$, and $z_5$, respectively. Electronics module 14 occupies a portion of the interior of cooling duct 12, thereby restricting airflow path P by reducing cross-sectional flow areas between $a_2$ and $a_3$. Cooling air flows through cross-sectional flow areas $a_0$, $a_1$, $a_2$, $a_3$, $a_4$, and $a_5$ at flow speeds $v_0$, $v_1$, $v_2$, $v_3$, $v_4$, and $v_5$, respectively. If airflow is considered one-dimensional in the z-direction and the velocities are in the z-direction, conservation of flow dictates that constrained cross-sectional flow areas produce faster flow speeds, such that $$a_0 v_0 = a_1 v_1 = \ldots = a_5 v_5.$$ [Equation 2]

Accordingly, the axial airflow speed at each vertex is determined by the width of airflow path P at that vertex. Velocities $v_0$, $v_1$, $v_2$, $v_3$, $v_4$, and $v_5$ are primarily axial, and local heat transfer is driven by axial flow of cooling airflow F.

Cooling airflow F through airflow path P cools electronics module 14 as it impinges on or flows past faces 14a, 14b, 14c, 14d, and 14e of electronics module 14. Increases in airflow speed at surfaces of electronics module 14 correspondingly increase heat convective cooling from direct airflow. In practice, some faces or locations on faces 14a, 14b, 14c, 14d, and 14e may produce more heat than others. Shaped baffle 26 is contoured to provide extra cooling for these "hot spots" by restricting nearby cross-sectional flow areas $a_0$, $a_1$, $a_2$, $a_3$, $a_4$, and/or $a_5$ to increase corresponding $v_0$, $v_1$, $v_2$, $v_3$, $v_4$, and/or $v_5$.

Although high flow speeds allow increased heat dissipation, high flow speeds and abrupt turns in shaped duct 26 also result in greater pressure losses, with corresponding power costs necessitating larger or faster fans, or greater air bleeds. In general, pressure drop ΔP across a length L at constant diameter d is $$\Delta P = \frac{\rho v^2}{2}\left(\frac{fL}{d} + k\right)$$ [Equation 3]

where ρ is air density, v is flow speed, f is a surface friction factor of cooling duct 12, and k is a loss factor from disruptions in the flow path. A 90° turn in airflow path P, for instance, might account for a loss factor between 0.3 (for a gradual turn) and 0.8 (for an abrupt turn). To improve power the power efficiency of cooling duct 12, shaped baffle 26 is configured not only to increase flow speeds $v_n$ at "hot spots," but to decrease flow speeds near cooler locations to reduce unnecessary pressure losses. In addition, shaped baffle 26 may be configured to avoid sharp angles between planes of surfaces 28, 30, and 32. Vertices may also be curved or blunted to reduce loss factors k at and near each vertex of shaped baffle 26.

As noted above, electronics module 14 is rated to safe temperature $T_{safe}$, and some regions of electronics module 14 may produce more heat than others. Shaped baffle 26 includes constrained or narrow regions configured to reduce cross-sectional flow area near "hot spots" on faces 14a, 14b, 14c, 14d, and/or 14e to ensure that electronics module 14 remains below safe temperature $T_{safe}$. Near cooler areas of electronics module 14, shaped baffle 26 includes expanded or open regions configured to increase cross-sectional flow area to reduce pressure loss and correspondingly improve power efficiency. Shaped baffle 26 substantially minimizes unnecessary pressure drop across cooling duct 12 while ensuring that electronics module 14 is uniformly cooled to below safe temperature $T_{safe}$. In the illustrated embodiment, electronics module 14 can, for example, have hot locations H and cool locations C. Electronics module 14 produces more heat at hot locations H than at cool locations C.

Figure 4:
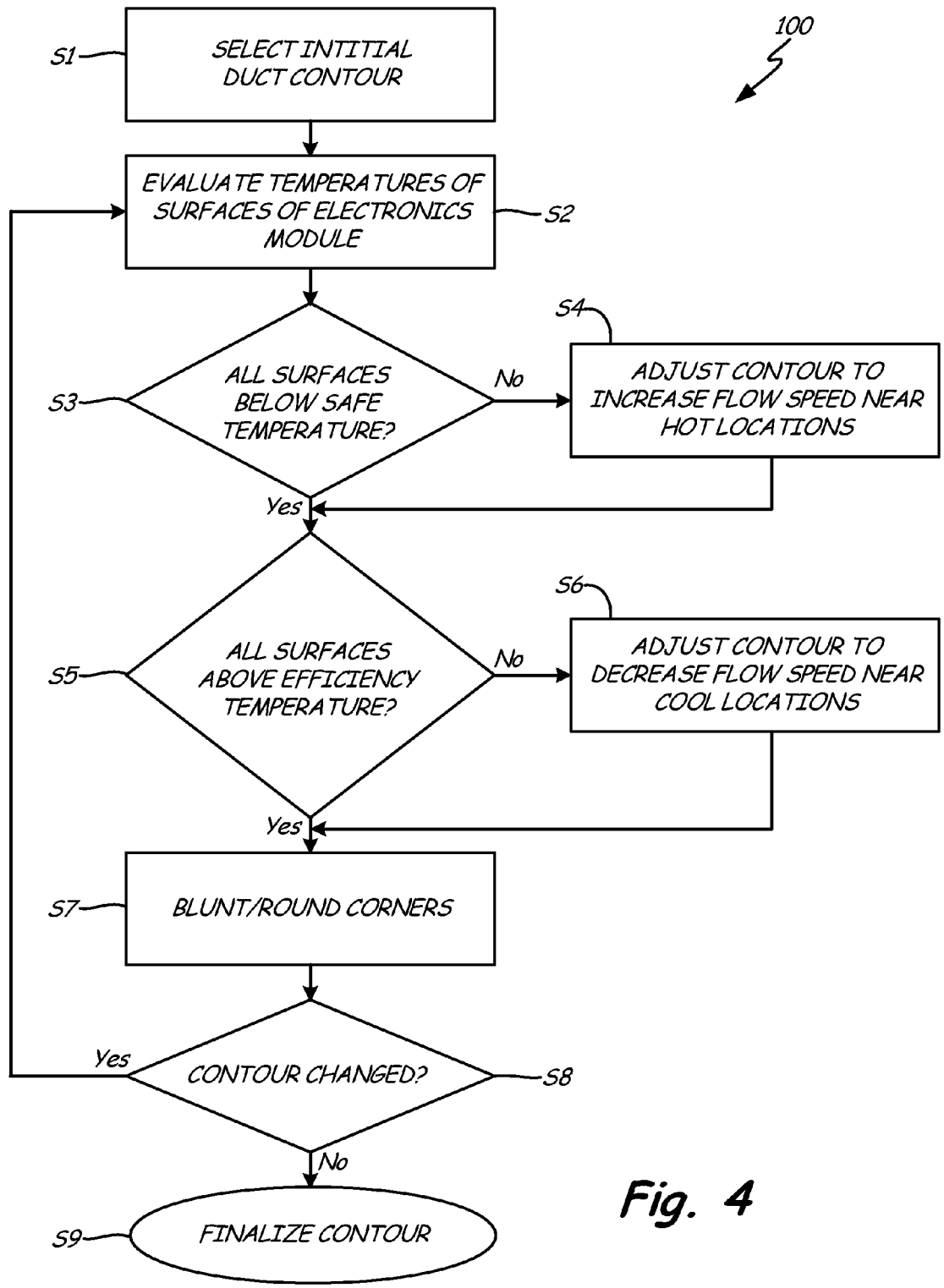
FIG. 4 is a flowchart of a method for defining contours of the cooling duct of FIG. 1.

FIG. 4 is a flowchart depicting shaped baffle design method 100. Shaped baffle design method 100 is an iterative method by which shaped baffle 26 is configured to minimize pressure drop across cooling duct 12 while adequately cooling electronics module 14. Shaped baffle design method 100 may be performed experimentally by constructing, altering, and measuring temperatures on surfaces of electronics module 14 within a physical duct. Alternatively, shaped baffled design method 100 may be performed virtually using Computational Fluid Dynamics (CFD) simulation or simplified analytic representation of cooling duct 12.

First, an initial duct contour is selected to cool electronics module 14. (Step S1). This initial duct contour may be an estimate based on prior experience or analogy to a similar cooling duct and electronics module. The initial duct contour includes a number of vertices of adjustable location. A large number of vertices may be selected for relatively smooth surfaces of shaped baffle 26 to reduce loss factors k and correspondingly improve power efficiency. Alternatively, a small number of vertices may be selected at key locations near faces of electronics module 16 (see FIGS. 2 and 3) for less complex manufacture.

Next, the cooled temperatures at surfaces of electronics module 14 are evaluated. (Step S2). As noted above, this evaluation can be physical or virtual. For physical evaluation, electronics module 14 may for instance be situated in a testing duct with a shaped baffle having the selected initial duct contour. Electronics module 14 is affixed with temperature sensors, and the operating temperature of electronics module 14 is sensed at locations on front face 14a, rear face 14b, side faces 14c and 14d, and top face 14e while cooling airflow is provided through cooling duct 12. For virtual evaluation, shaped baffle 26 and electronics module 14 may be modeled using a CFD simulation or a simplified analytic estimate of temperature based on cooling airflow rate and known heat output at a plurality of points on front face 14a, rear face 14b, side faces 14c and 14d, and top face 14e of electronics module 14.

The evaluated temperatures at surfaces of electronics module 14 are compared with rated safe temperature $T_{safe}$ to determine whether all locations on front face 14a, rear face 14b, side faces 14c and 14d, and top face 14e are operating below safe temperature $T_{safe}$. (Step S3). If any temperature exceed $T_{safe}$, coordinates of vertices of shaped baffle 26 near "hot spots" (e.g. coordinates $z_0$, $x_0$, $z_1$, $x_1$, $z_2$, $x_2$, $z_3$, $x_3$, $z_4$, $x_4$, $z_5$, and/or $x_5$ of vertices $V_{0,30}$, $V_{1,30}$, $V_{2,30}$, $V_{3,30}$, $V_{4,30}$ and/or $V_{5,30}$) are adjusted to locally reduce cross-sectional flow area and correspondingly increase flow speed and heat dissipation. (Step S4). Vertex coordinates are adjusted only in small step sizes. In some applications, step size may depend on the amount by which "hot spot" temperature exceeds safe temperature $T_{safe}$.

The evaluated temperatures at surfaces of electronics module 14 are next compared with rated temperature $T_{safe}$ to determine whether locations on front face 14a, rear face 14b, side faces 14c and 14d, and top face 14e are operating above efficient temperature $$T_{efficient} = T_{safe} - \Delta T \quad \text{[Equation 4]}$$

where $\Delta T$ is an efficiency margin selected to avoid overcooling and corresponding unnecessary pressure and power loss. (Step S5). Efficiency margin $\Delta T$ may, for instance, be 5-10% of safe temperature $T_{safe}$. A narrower efficiency margin $\Delta T$ will tend to cause method 100 to require more steps to converge on a finalized contour for shaped baffle 26, and will more precisely minimize pressure loss across cooling duct 12 for optimal power efficiency. Efficiency margin $\Delta T$ may be selected based on the accuracy possible with the evaluation of step S2. The more accurately and reliably predicted temperatures on faces 14a, 14b, 14c, 14d, and 14e of electronics module 14 are, the narrower efficiency margin $\Delta T$ may be. If any temperatures on electronics module 14 fall below $T_{efficient}$, coordinates of vertices of shaped baffle 26 near these "cold spots" are adjusted to locally increase cross-sectional flow area and correspondingly reduce flow speed and pressure drop. (Step S6). As in step S4, vertex coordinates are adjusted only in small step sizes.

In some embodiments of the method 100, vertices of shaped contour 26 may be blunted or rounded to reduce pressure loss from abrupt turns in flow path P. (Step S7). In some embodiments vertices may be rounded by applying a fixed radius of curvature to all vertices. In other embodiments larger radii of curvature may be applied to vertices with higher airflow speeds or larger turn angles.

In the depicted embodiment, steps S2 through S7 of method 100 repeat until neither step S3 nor step S5 prompt adjustment of vertices of shaped baffle 26 (in steps S4 and S6). (Step S8). The resulting contour of shaped baffle 26 is then finalized. (Step S9). Although FIG. 3 shows step S7 as following step S6, some embodiments of method 100 may blunt or round vertices of shaped contour 26 only after finalizing vertex locations in step S9. The finalized contour of shaped baffle 26 produced in step S9 ensures that each surface of electronics module 14 is cooled to below safe temperature $T_{safe}$, while substantially minimizing pressure drop across cooling duct 12 with a precision determined by the width of efficiency margin $\Delta T$. Shaped baffle 26 allows electronics module 14 to be cooled to safe levels with five to ten times less pressure drop across duct 12 than in an uncontoured duct, with a corresponding five- to tenfold increase in power efficiency.

Figure 5:
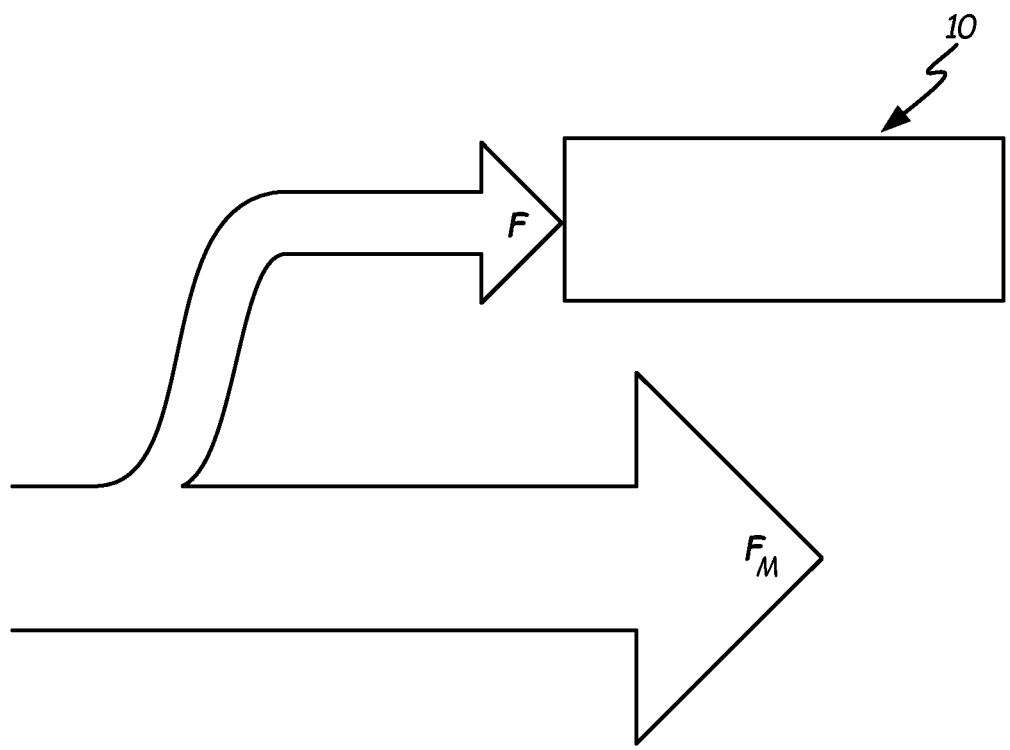
FIG. 5 is a schematic block diagram of an airflow bleed feeding the cooling duct of FIG. 1.

FIG. 5 is a schematic block diagram illustrating airflow bleed for cooling system 10. In one embodiment, airflow F is split or diverted from main airflow $F_M$. Main airflow $F_M$ can, for example, be fan airflow as noted above with respect to FIG. 1.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A cooling system comprising:
    a electronics module that produces more heat at a first location than at a second location, and that is rated to a safe operating temperature;
    a duct surrounding the electronics module and having a shaped baffle with a constricted region near the first location and an open region with greater cross-sectional flow area than the constricted region near the second location, such that airflow through the duct cools both the first location and the second location to within an efficiency margin below the safe operating temperature.

2. The cooling system of claim 1, wherein the efficiency margin is 10% or less than the safe operating temperature.

3. The cooling system of claim 2, wherein the efficiency margin is 5% or less than the safe operating temperature.

4. The cooling system of claim 1, wherein the shaped baffle has a contour described by a plurality of vertices with coordinates selected to vary the width of an air passage through the duct to form the constricted region and the open region.

5. The cooling system of claim 1, further comprising an airflow source.

6. The cooling system of claim 5, wherein the airflow source is a fan.

7. The cooling system of claim 5, wherein the airflow source is an air bleed.

8. The cooling system of claim 1, wherein the electronics module is a transformer or an inductor.

9. The cooling system of claim 1, wherein the shaped baffle increases power efficiency of cooling the electronics module to below the safe operating temperature by a factor of five or more over an uncontoured duct of similar dimensions.

10. The cooling system of claim 9, wherein the shaped baffle decreases power requirements of cooling the electronics module to below the safe operating temperature by a factor of ten or more over an uncontoured duct of similar dimensions.

11. A method for designing contours of a duct to cool an electronics module, the method comprising:
    iteratively adjusting a baffle contour from an initial estimate to decrease cross-sectional flow area near regions of the electronics module above a first temperature threshold; and iteratively adjusting an the baffle contour from the initial estimate to increase cross-sectional flow area near regions of the electronics module below a second temperature threshold lower than the first temperature threshold.

12. The method of claim 11, wherein the first temperature threshold is a rated safe temperature selected to avoid deterioration or damage to the electronics module.

13. The method of claim 12, wherein the second temperature threshold is separated from the first temperature threshold by an efficiency margin selected to substantially minimize pressure drop across the cooling fan duct while cooling the electronics module to below the rated safe temperature.

14. The method of claim 12, wherein the efficiency margin is 10% or less of the rated safe temperature.

15. The method of claim 11, further comprising finalizing the baffle contour when iterative adjustment produces a contour such that all regions of the electronics module are cooled to a temperature between the first and second temperature thresholds.

16. The method of claim 11, further comprising rounding vertices of the baffle contour to soften abrupt airflow path transitions in the duct.

17. A method for cooling an electronics module with relatively hot and relatively cool regions and a safe operating temperature, the method comprising:

forcing airflow through a duct containing a shaped baffle;

increasing flow speed at a constricted region produced by the baffle near the relatively hot region such that the relatively hot region is cooled to within an efficiency margin below the safe operating temperature; and decreasing flow speed at an expanded region produced by the baffle near the relatively cool region such that the cool regions is cooled to within an efficiency margin below the safe operating temperature.

18. The method of claim 17, wherein the efficiency margin is 10% or less than the safe operating temperature.

19. The method of claim 17, wherein forcing the airflow through a duct comprises driving the airflow with a fan.

20. The method of claim 17, wherein forcing the airflow through the duct comprises diverting the airflow from an air system via a bleed.

* * * * *